(12) United States Patent
Fujiwara et al.

(10) Patent No.: US 7,491,652 B2
(45) Date of Patent: Feb. 17, 2009

(54) IN-LINE PROCESSING FOR FORMING A SILICON NITRIDE FILM

(75) Inventors: Naonori Fujiwara, Tokyo (JP); Hiroyuki Kitamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 195 days.

(21) Appl. No.: 11/474,460

(22) Filed: Jun. 26, 2006

(65) Prior Publication Data
US 2007/0004223 A1    Jan. 4, 2007

(30) Foreign Application Priority Data
Jun. 29, 2005    (JP)    ............................. 2005-190068

(51) Int. Cl.
 H01L 21/31    (2006.01)
 H01L 21/469    (2006.01)
(52) U.S. Cl. ................... 438/775; 438/791; 438/905; 257/E21.267; 257/E21.293; 257/E21.302
(58) Field of Classification Search ............... 438/775, 438/197, 238, 381, 663, 680, 724, 744, 745, 438/762, 791, 798, 905, 683, 757
 See application file for complete search history.

(56) References Cited

U.S. PATENT DOCUMENTS 6,001,742 A * 12/1999 Chang ................... 438/706
7,041,178 B2 * 5/2006 Tong et al. ............... 148/33.4
7,074,720 B2 * 7/2006 Arita et al. ............... 438/706
7,232,492 B2 * 6/2007 Won et al. ................ 134/1
7,273,763 B1 * 9/2007 Neumeier et al. .......... 438/52

FOREIGN PATENT DOCUMENTS

| JP | 5-218014 | 8/1993 |
|----|----------|--------|
| JP | 10-32195 | 2/1998 |
| JP | 2003-188178 | 7/2003 |

OTHER PUBLICATIONS

Japanese Office Action dated Jun. 5, 2008, with partial English translation.

* cited by examiner

*Primary Examiner*—David Nhu
(74) *Attorney, Agent, or Firm*—McGinn IP Law Group, PLLC

(57) ABSTRACT

A process for manufacturing semiconductor devices in an in-line processing includes the steps of: forming a silicon nitride film on a semiconductor wafer by nitrization in a reactor chamber having an inner pressure at a specific pressure; reducing the inner pressure from the specific pressure; raising the inner pressure up to the specific pressure; replacing the semiconductor wafer with another semiconductor wafer; and forming a nitride film on the another semiconductor wafer at the specific pressure.

6 Claims, 12 Drawing Sheets

IN-LINE PROCESSING FOR FORMING A SILICON NITRIDE FILM

BACKGROUND OF THE INVENTION (a) Field of the Invention

The present invention relates to a method for manufacturing semiconductor devices and, more particularly, to the improvement of the technique forming a nitride film on the surface of semiconductor wafers by using a nitrifying process.

(b) Description of the Related Art

Figure 10:
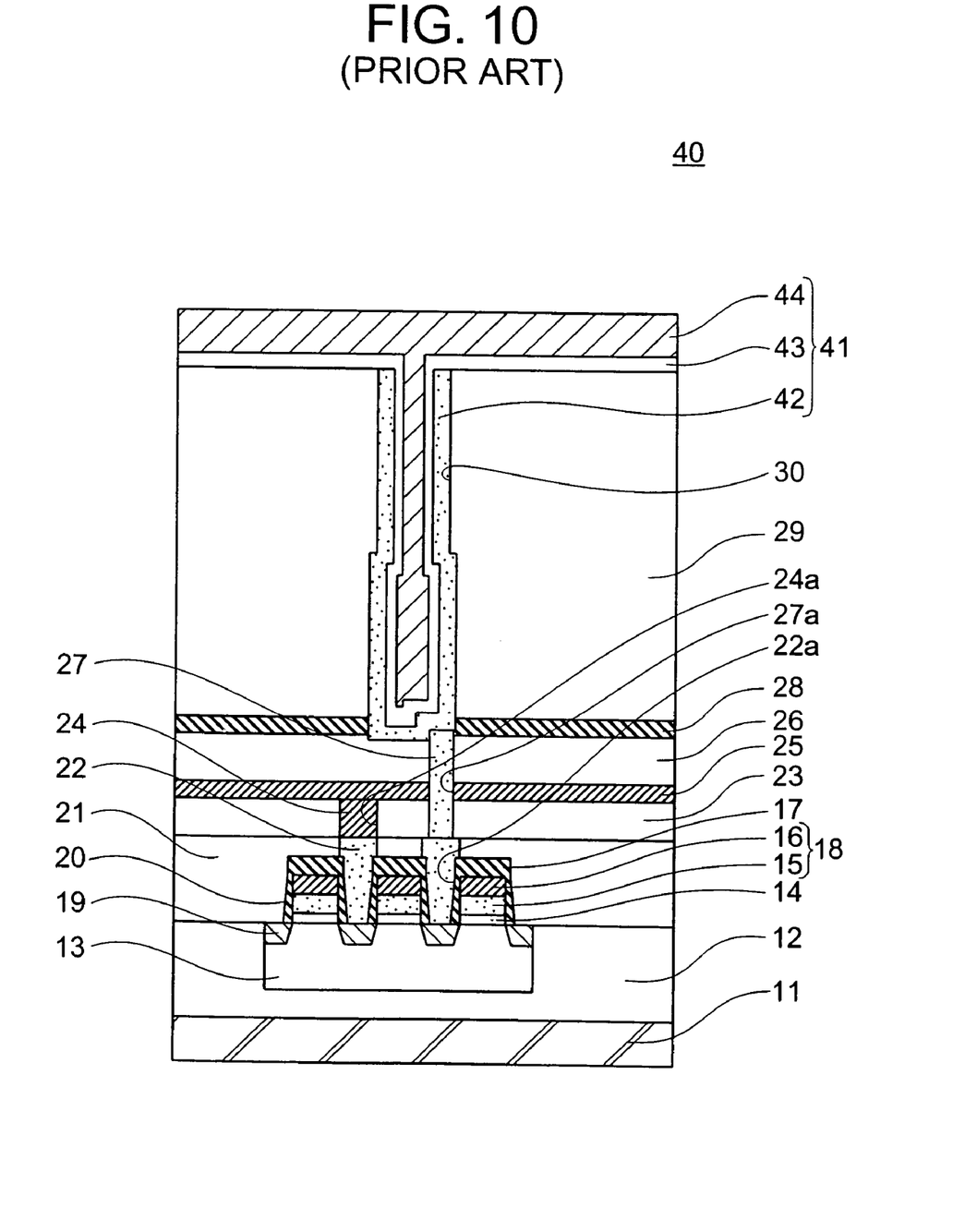
FIG. 10 is a sectional view of a conventional semiconductor device including a memory cell.

For achieving a higher integrity of semiconductor devices, the technique for reducing the dimensions of constituent elements in the semiconductor devices has been developed. The area for semiconductor memory elements, which are the main constituent elements in the semiconductor devices, has also been reduced without allowing reduction of the memory capacity. FIG. 10 shows an example of a memory cell in a semiconductor device.

The memory cell formed in a conventional semiconductor device 40 includes a MIS transistor formed on the surface region of a semiconductor substrate 11, and a capacitor 41 connected to and overlying the MIS transistor. The semiconductor device 40 includes an array of such memory cells arranged in a matrix on the semiconductor substrate 11. The capacitor 41 includes a bottom electrode 42 formed within a cylindrical hole 30 penetrating a thick insulation film 29, a capacitor insulation film 43 formed on the inner and top surfaces of the bottom electrode 42, and a top electrode 44 opposing the bottom electrode 42 via the capacitor insulation film 43. The bottom electrode 42 is made of polysilicon, for example, heavily doped with phosphorous for suppression of depletion.

As a measure for achieving a higher capacitance for the capacitor in the memory cell without increasing the occupied area thereof, use of a metal oxide film having a higher permittivity as the capacitor insulation film is being investigated. The metal oxide film should be preferably associated with a silicon nitride film formed on the bottom electrode prior to formation of the metal oxide film for prevention of oxidation of the bottom electrode. The silicon nitride film should have a smaller thickness because the silicon nitride film has a relatively lower permittivity. Such a thin silicon nitride film is formed, for example, by a rapid thermal nitrization (RTN) treatment wherein a lamp anneal is conducted in a nitride-compound-gas atmosphere such as including $NH_3$. The technique using the RTN treatment is described in Patent Publication JP-2003-188178A, for example.

The present inventors manufactured in a research a plurality of sample semiconductor devices including the metal oxide film and a silicon nitride film as a capacitor insulation film, and found that a larger range of variation exists in the capacitor characteristics between the sample semiconductor devices. This variation occurred in the capacitor characteristics including the capacitance and leakage current of the capacitor although the silicon nitride films in those samples were formed in similar process conditions within the same reactor chamber for the RTN treatment.

A further research revealed that if the silicon nitride films in a plurality of semiconductor devices are manufactured by the repeated RTN treatment in an in-line processing in the same reactor chamber, a semiconductor device formed in a later RTN treatment has a tendency of incurring a larger reduction in the film thickness and film quality of the silicon nitride film. It is thus concluded that the variation in the capacitor characteristics as described above resulted from the reduction in the film thickness and film quality of the silicon nitride film in the capacitor. Thus, it is essential to achieve a silicon nitride film having a more uniform film thickness and film quality irrespective of the RTN repetition times in the in-line RTN processing using the same reactor chamber.

SUMMARY OF THE INVENTION

In view of the above problems in the conventional techniques, it is an object of the present invention to provide a method for manufacturing semiconductor devices, which is capable of achieving a uniform film thickness and film quality for the silicon nitride film irrespective of the repetition times in the in-line processing.

The present invention provides a method for manufacturing semiconductor devices in an in-line processing, the method including, between the step of forming a silicon nitride film by using nitrification on a first semiconductor wafer in a reactor chamber at a specific pressure and the step of forming a silicon nitride film by using nitrification on a second semiconductor wafer in the reactor chamber at the specific pressure, the steps of reducing the inner pressure from the specific pressure; raising the inner pressure up to the specific pressure; and replacing the semiconductor wafer with another semiconductor wafer.

In accordance with the method of the present invention, the reduction of the internal pressure of the reactor chamber reduces the amount of by-product materials attached onto the inner wall of the reactor chamber.

The above and other objects, features and advantages of the present invention will be more apparent from the following description, referring to the accompanying drawings.

PREFERRED EMBODIMENT OF THE INVENTION

According the research by the inventors, the fact that the semiconductor device manufactured in a later RTN treatment in the in-line RTN processing has an inferior film quality resulted from the reasons as detailed below.

During formation of the silicon nitride film, a variety of by-product materials are generally formed due to desorption from and/or nitrification of the surface of the wafer, attaching onto the inner surface of the reactor chamber. The by-product materials attached onto the inner surface of the reactor chamber are not removed from the chamber during a waiting stage of the chamber, wherein the chamber is subjected to the internal pressure maintained at the same pressure during formation of the silicon nitride film. The by-product materials are desorped from the inner surface of the reactor chamber into the ambient gas of the in-line RTN processing at a high temperature maintained during formation of the silicon nitride film for the next semiconductor device. Some of the by-product materials in the ambient gas adversely affect property of the silicon nitride film, reducing the film thickness or changing the composition of the resultant silicon nitride film to reduce the film quality thereof.

The mount of by-product materials attached onto the inner surface of the rector chamber increases with the repetition of RTN treatment for the wafers in the in-line processing, thereby increasing the amount of by-product materials in the ambient gas during the in-line processing. Thus, the semiconductor device manufactured later in the in-line processing has a poorer film quality and a smaller film thickness, resulting in an inferior capacitor characteristics.

Based on the above findings, the inventors conceived that suppression of the attachment of the by-product materials onto the inner surface of the reactor chamber, if achieved, will reduce the adverse influence on the silicon nitride film due to reduction of the by-product materials in the ambient gas. In addition, the inventors noticed the step of reducing the internal pressure of the reactor chamber in order to reduce the amount of by-product materials in the ambient gas. This step will discharge the by-product materials out of the reactor chamber. That is, the reduction of the internal pressure of the reactor chamber will assist desorption of the by-product materials from the inner surface of the reactor chamber and then effectively discharge the by-product out of the reactor chamber.

The inventors conducted a variety of experiments based On the above findings and considerations, thereby confirming that reduction of the internal pressure of the reactor chamber prior to shifting to the waiting stage of the reactor chamber provides an excellent silicon nitride film having uniform film thickness and uniform film quality, irrespective of the repetition times of the in-line RTN processing in the same reactor chamber.

Figure 1:
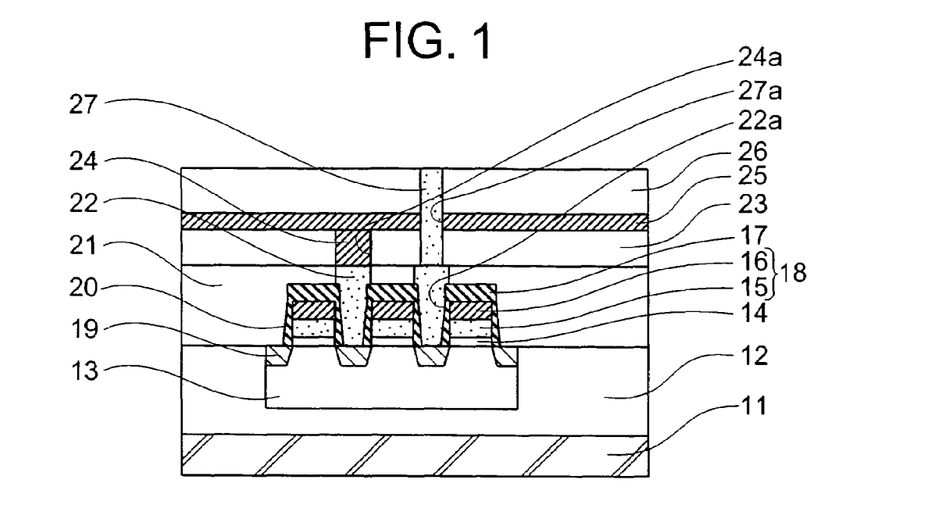
FIGS. 1 to 6 are sectional views of a semiconductor device consecutively showing steps of a process for manufacturing the semiconductor device according to a first embodiment of the present invention.

Now, the present invention is more specifically described with reference to accompanying drawings, wherein similar constituent elements are designated by similar reference numerals throughout the drawings. FIGS. 1 to 6 consecutively show steps of a process for manufacturing semiconductor devices according to a first embodiment of the present invention. The semiconductor devices manufactured by the process are DRAM devices. The process starts at the step of forming an n-well 12 on the surface region of a p-type silicon substrate 11, as shown in FIG. 1, followed by forming a p-well 13 having a small depth in the n-well 12. Subsequently, a gate insulation film 14 is formed on the silicon substrate 11.

Thereafter, polysilicon film 15, metallic film 16 and silicon nitride film 17 are consecutively formed on the gate insulation film 14, followed by patterning the silicon nitride film 17 by using a photolithographic and etching technique. The metallic film 16, polysilicon film 15 and gate insulation film 14 are then patterned using the patterned silicon nitride film 17 as a hard mask to obtain gate electrodes 18. Subsequently, ion-implantation is conducted to the surface region of the silicon substrate 11, thereby forming source/drain regions 19 of MOSFETs.

Thereafter, a silicon nitride film is deposited on the entire surface, followed by anisotropic etching thereof to leave a sidewall film 20 on the sidewall of the gate electrodes 18 and silicon nitride film 17.

A first interlevel dielectric film 21 is then deposited on the entire surface, followed by etching the same to form contact holes 22a therein by using a photolithographic and etching technique using a photoresist pattern and the sidewall film 20 as a mask in a self-alignment process. The contact holes 22a are then filled with polysilicon to form contact plugs 22.

Thereafter, a second interlevel dielectric film 23 is deposited on the entire surface, followed by etching the same to form therein through-holes 24a exposing therethrough the contact plugs 22. The through-holes 24a are then filled with a conductive material to form therein bit-line contacts 24. Subsequently, a metallic film is deposited on the second interlevel dielectric film 23, followed by patterning thereof to form bit lines on top of the bit-line contacts 24.

A third interlevel dielectric film 26 is then deposited on the bit lines 25 and second interlevel dielectric film 23, followed by etching the second and third interlevel dielectric films 23, 26 to form through-holes 27a exposing therefrom the top of the contact plugs 22. The through-holes 27a are then filled with polysilicon to form plugs 27, thereby obtaining the structure of FIG. 1.

Figure 2:
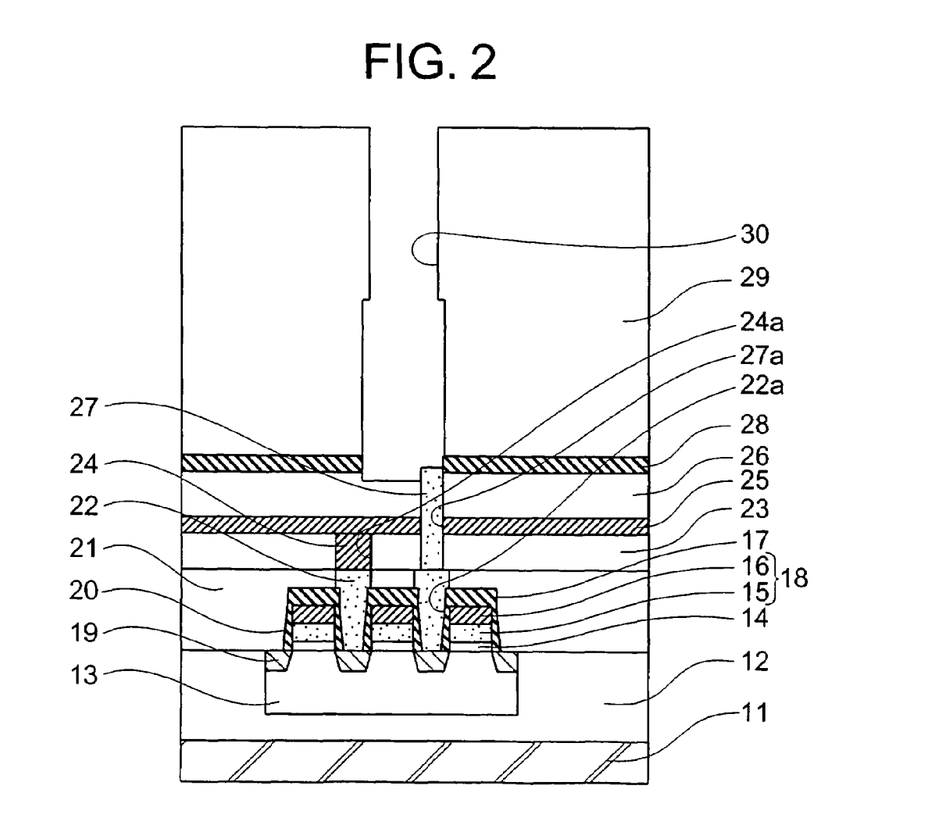

Thereafter, a silicon nitride film 28 is deposited on the third interlevel dielectric film 26 by using a CVD (chemical vapor deposition) technique. A thick fourth interlevel dielectric film 29 is then deposited on the silicon nitride film 28, followed by dry-etching thereof to form cylindrical holes 30 exposing therethrough the top of the plugs 27, as shown in FIG. 2.

Figure 3:
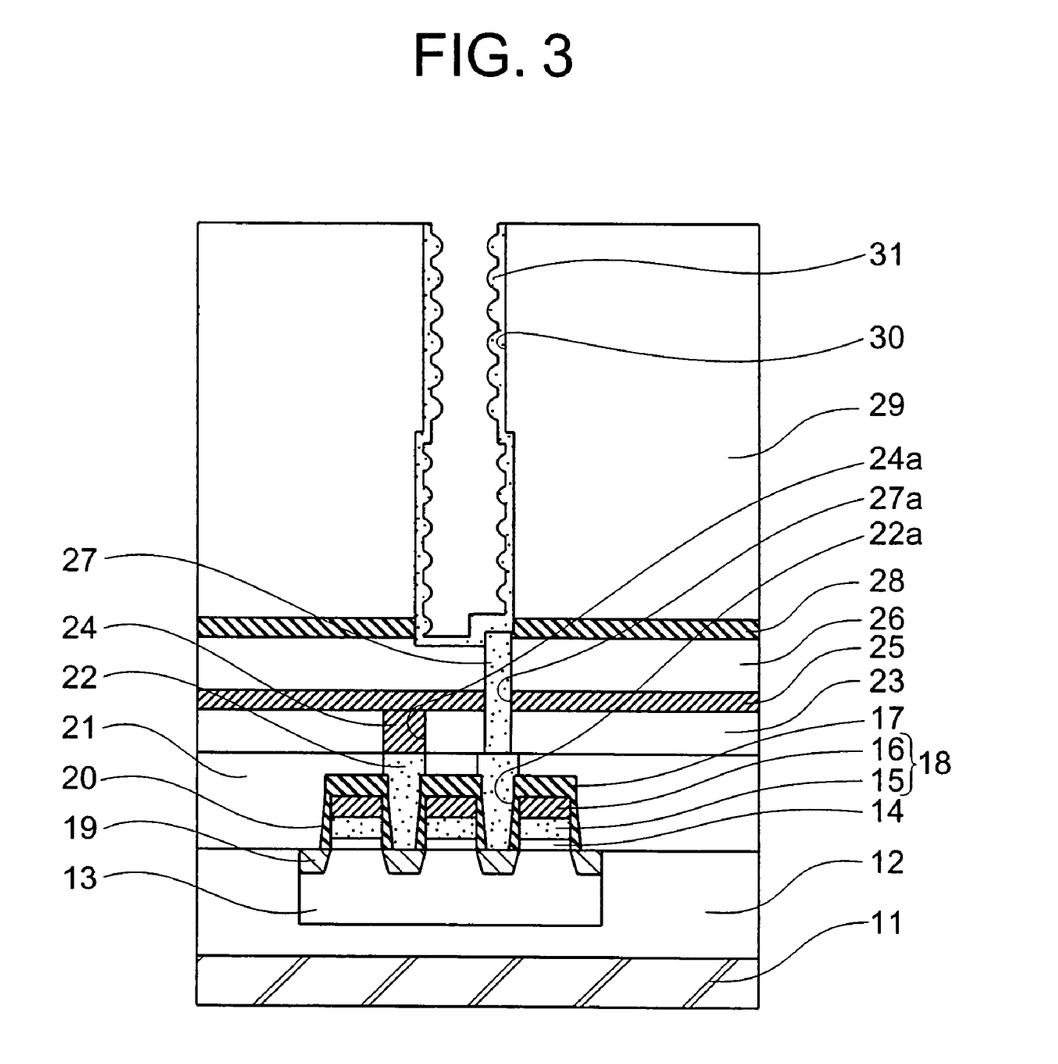
Figure 4:
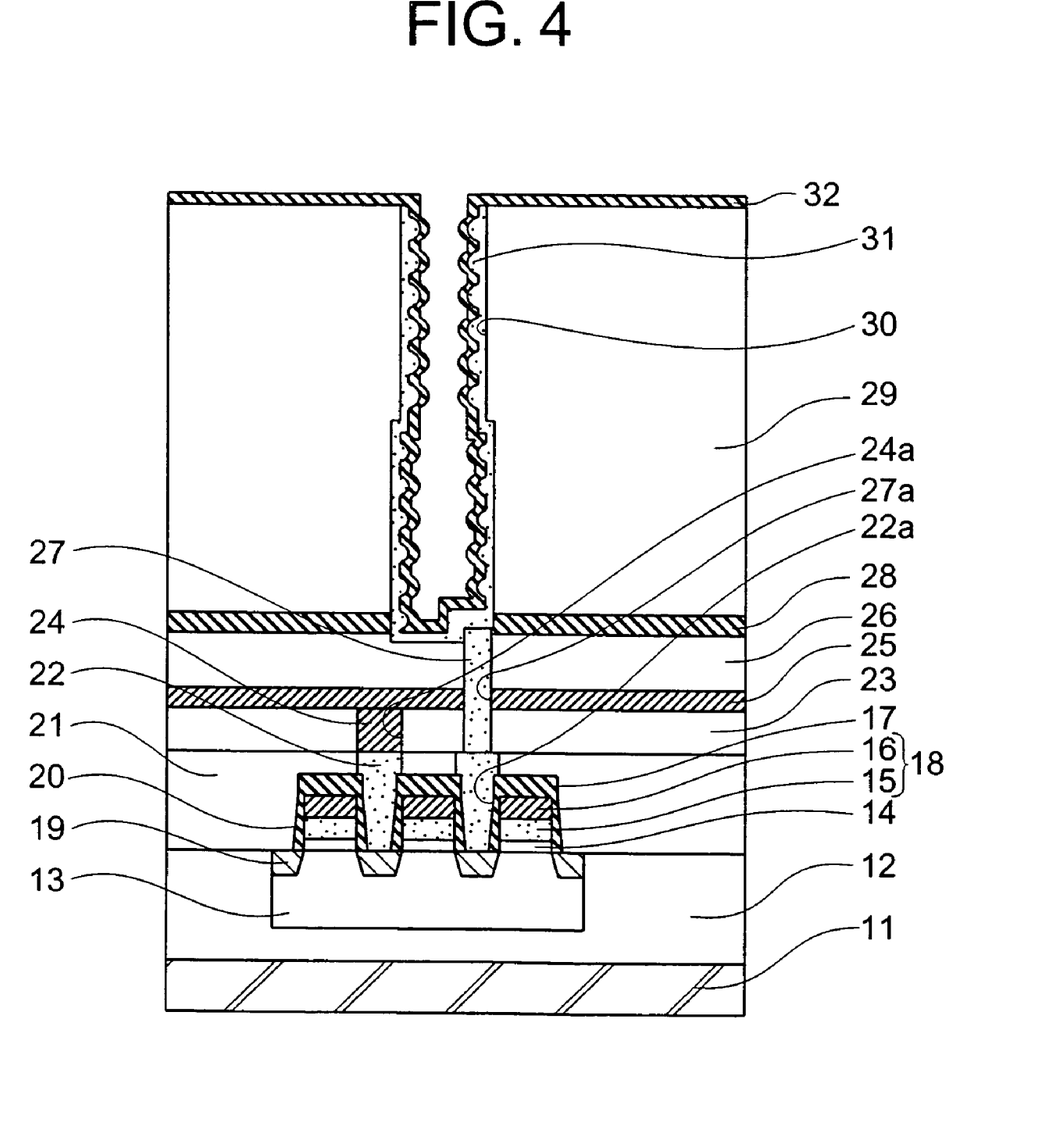

Thereafter, as shown in FIG. 3, phosphorous-doped polysilicon is deposited and patterned to form bottom electrodes 31 within the cylindrical holes, the bottom electrodes 31 having a hemi-spherical-grain (HSG) structure on the exposed surface thereof. An anneal treatment is then conducted in a $PH_3$-gas atmosphere for suppressing depletion of the polysilicon configuring the bottom electrodes 31, followed by heavily-doping the surface of the bottom electrodes 31 with phosphorous. A RTN treatment is then conducted in the $PH_3$-gas atmosphere to nitride the surface of the polysilicon, thereby forming a thin silicon nitride film 32 thereon and on the fourth interlevel dielectric film 29, as shown in FIG. 4.

Figure 5:
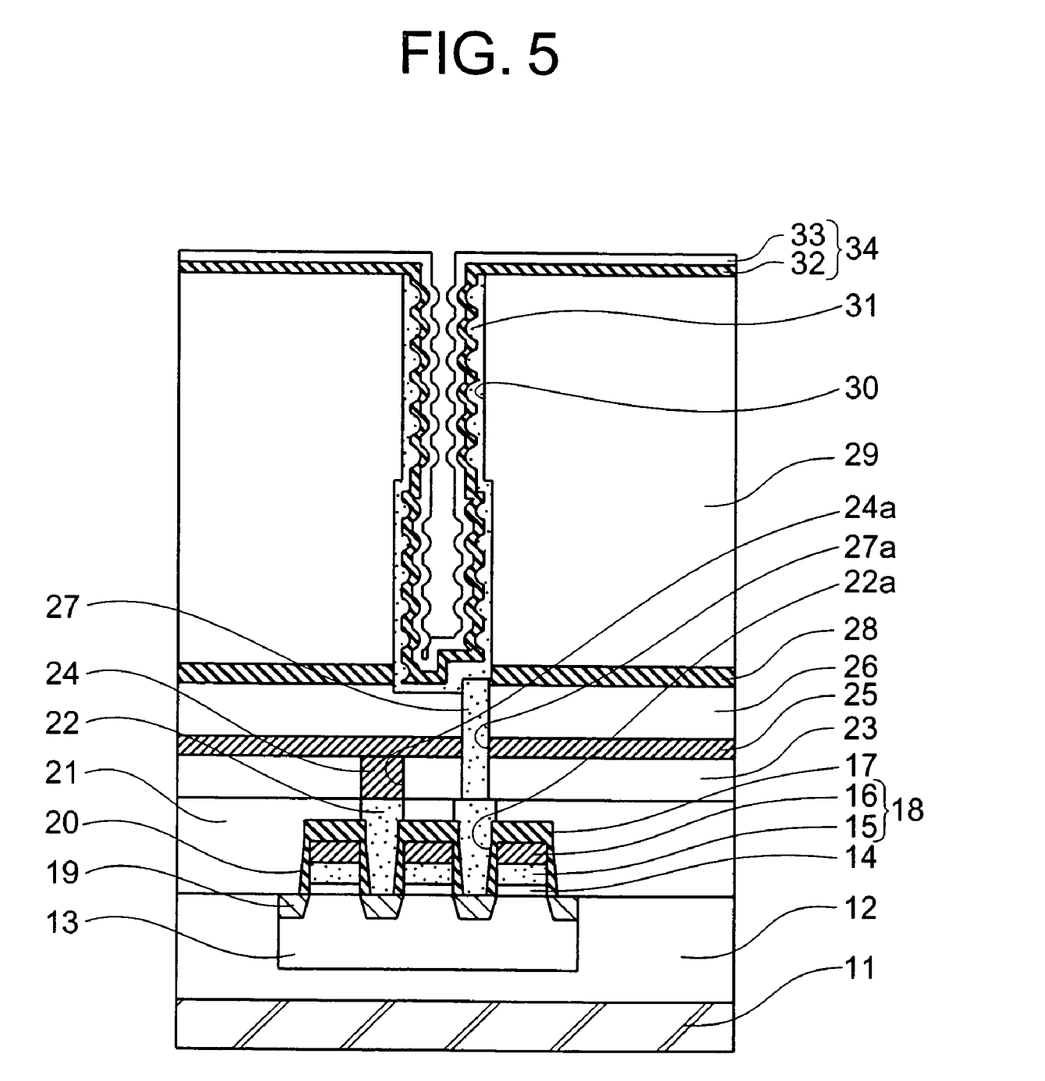
Figure 6:
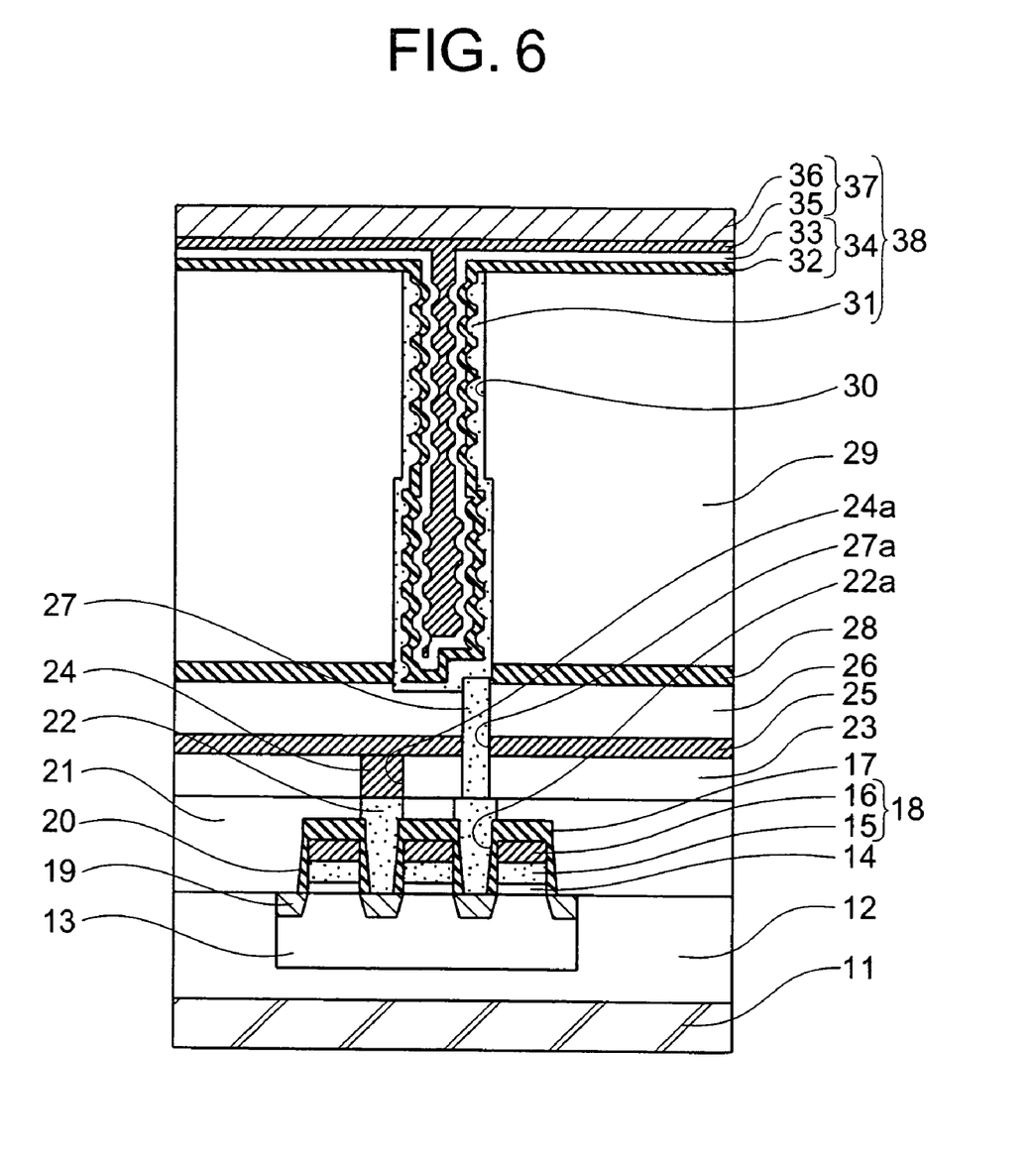

Thereafter, as shown in FIG. 5, a tantalum pentoxide film 33 is deposited on the silicon nitride film 32 by using a CVD technique. The silicon nitride film 32 and tantalum pentoxide film 33 in combination configure a capacitor insulation film 34. Subsequently, as shown in FIG. 6, titanium nitride film 35 and tungsten film 36 are consecutively deposited on the capacitor insulation film 34 by using a CVD technique to form top electrodes 37, which oppose the bottom electrodes 31 within the cylindrical holes 30. This step achieves memory capacitors 38 in the DRAM device. Other interconnections are then formed on the structure of FIG. 6, and the resultant wafer is subjected to dicing to thereby obtain a large number of separate semiconductor devices.

The RTN treatment for forming the silicon nitride film 32 is conducted by using an in-line processing in a dedicated reactor chamber so as to obtain rapid temperature rise and rapid temperature fall. The dedicated chamber is coupled to $NH_3$-gas source and $N_2$-gas source whereby the internal pressure of the chamber is controlled at any desired pressure. The chamber is provided with a lamp for irradiating the semiconductor wafer to raise the temperature thereof.

Figure 7:
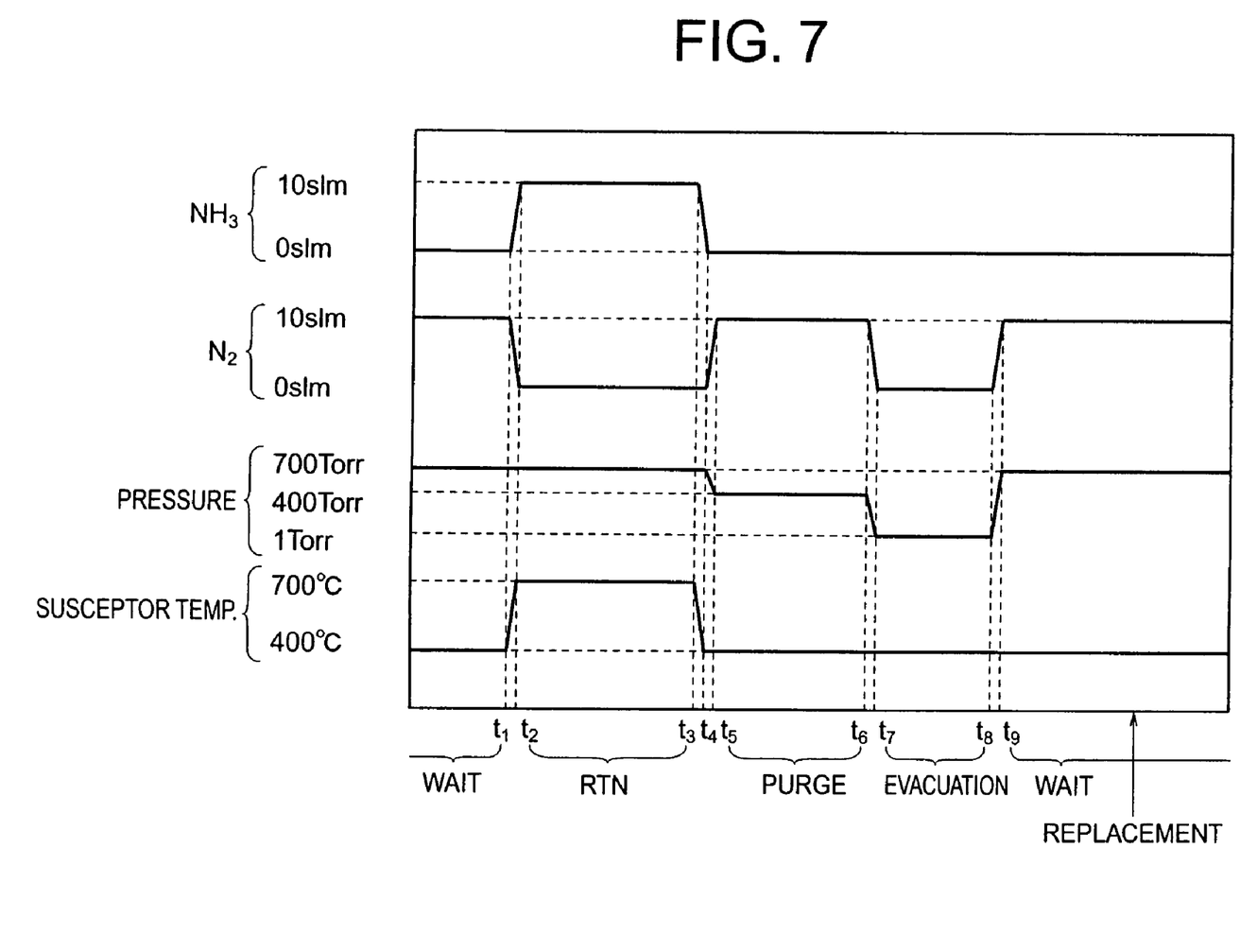
FIG. 7 is a timing chart of the process conditions in the process of the first embodiment during forming the silicon nitride film.

FIG. 7 shows a timing chart of processing conditions used in the above process within the reactor chamber. A wafer to be subjected to the RTN processing is mounted on a susceptor installed within the chamber, followed by a waiting stage wherein the flow rate of $N_2$ gas is set at 10 slm. (standard litter/min), the internal pressure is set at 700 Torr, and the substrate temperature is set at 400 degrees C. The substrate temperature is set by controlling the irradiation by the lamp.

At time instant t1, supply of the $N_2$ gas is stopped, the flow rate of $NH_3$ gas is set at 10 slm., and the substrate temperature is set at 700 degrees C., whereby a RTN treatment is conducted to form a silicon nitride film on the wafer between t2 and t3.

Thereafter, supply of the $NH_3$ gas is stopped, and the substrate temperature is set at 400 degrees C. from t4. Further, the flow rate of the $N_2$ gas and the internal pressure are set at 10 slm. and 400 Torr, respectively, thereby performing a gas purge treatment under a reduced pressure between t5 and t6. The substrate temperature may be set other than 400 degrees C. so long as no silicon nitride film is formed on the wafer in the $N_2$ gas atmosphere.

Thereafter, supply of the $N_2$ gas is stopped, and the chamber is evacuated down to an internal pressure of 1 Torr between t7 and t8. Subsequently, a waiting stage starts at t9 wherein the flow rate of the $N_2$ gas and internal pressure are set at 10 slm. and 700 Torr, respectively. During the waiting stage, the wafer on which the silicon nitride film is formed is taken out from the chamber and another wafer is received in the chamber and mounted on the susceptor. Another RTN treatment then starts at t1.

In the process of the present embodiment, the configuration wherein a low-pressure purge is conducted subsequent to formation of the silicon nitride film suppresses generation of the by-product materials within the chamber and attachment of the by-product materials onto the inner wall of the chamber, and effectively discharge the by-product materials out of the chamber. The evacuation in the present embodiment allows the by-product materials attached onto the inner wall of the chamber to be desorped therefrom, thereby reducing the amount of by-product materials attached onto the inner wall of the chamber during a next RTN treatment.

The reduction in the amount of the by-product materials suppresses the adverse affect on the deposition of the silicon nitride film by the by-product materials. Thus, a silicon nitride film having uniform film thickness and film quality can be obtained irrespective of the RTN repetition times of the in-line processing, whereby semiconductor devices can be obtained including capacitors having uniform and excellent capacitor characteristics. It is to be noted that the by-product materials possibly include phosphorous discharged from the surface of the bottom electrodes.

Figure 11:
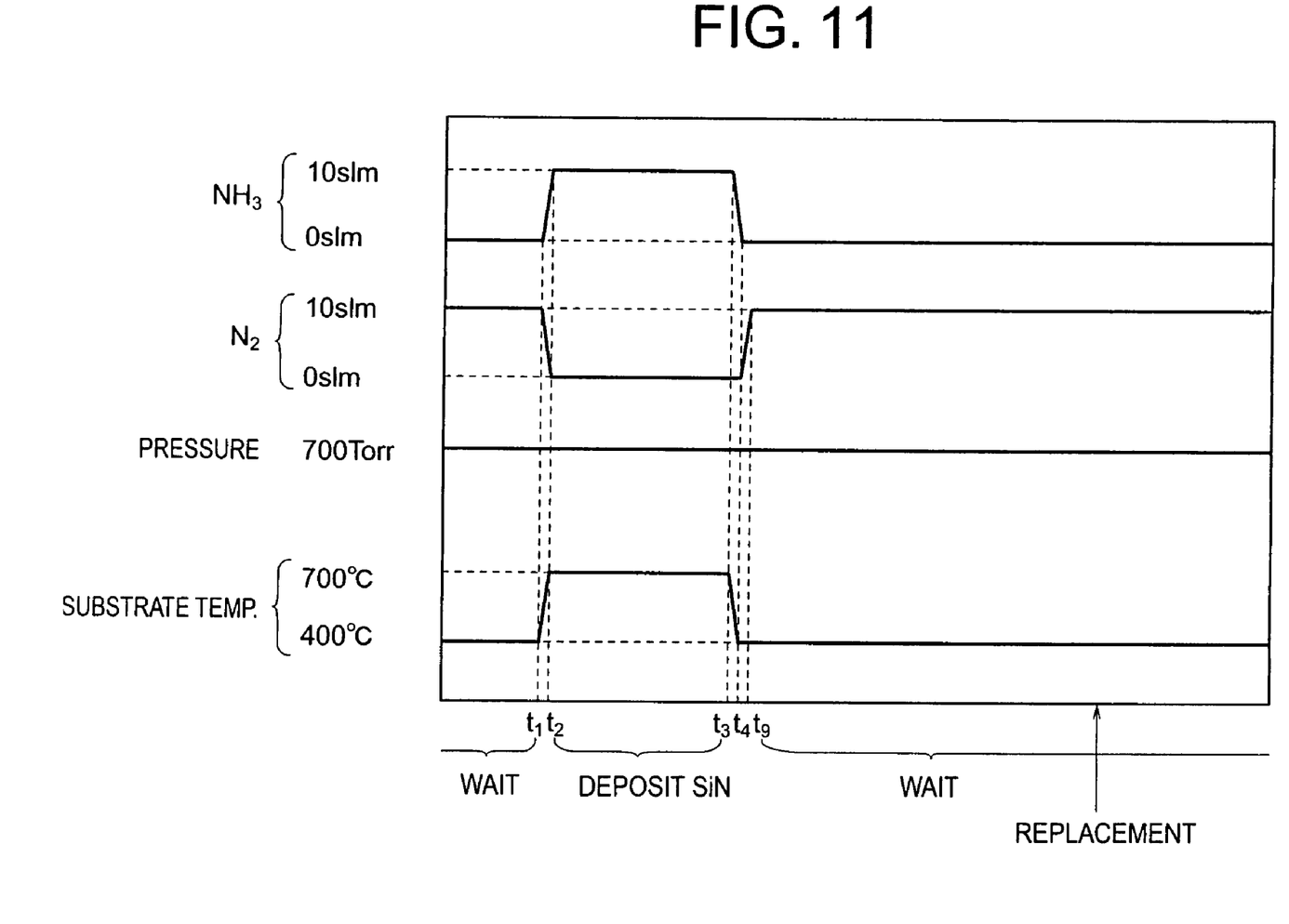
FIG. 11 is a timing chart of the process conditions in a conventional process for manufacturing a semiconductor device.

The process of the present embodiment was compared against the conventional process conducted based on the timing chart shown in FIG. 11. The conventional process using the process conditions shown in FIG. 11 is similar to the process of the present embodiment shown in FIG. 7, except for the low-pressure purge and evacuation steps being omitted in FIG. 11.

Manufacture of sample semiconductor devices was conducted in a new in-line processing chamber, wherein a silicon nitride film was formed on each of the sample wafers in number of 25 sheet for each of the processes shown in FIGS. 7 and 11. The maximum charge stored on the capacitor at a specific voltage was measured for each of the semiconductor devices in a charge test, to obtain the capacitance (fF/bit) of the capacitor, and the measured capacitance was averaged for all the semiconductor devices in each of the wafers consecutively obtained in the in-line processing.

A data retention test was also conducted in each of the sample semiconductor devices, wherein it was judged whether or not a specified charge is retained in the capacitor for a specified time length or longer. If the result is affirmative, the sample is judged as a passed sample. In this data retention test, the ratio of the number of passed samples to the total number of the samples was calculated for each of the wafers.

Figure 12:
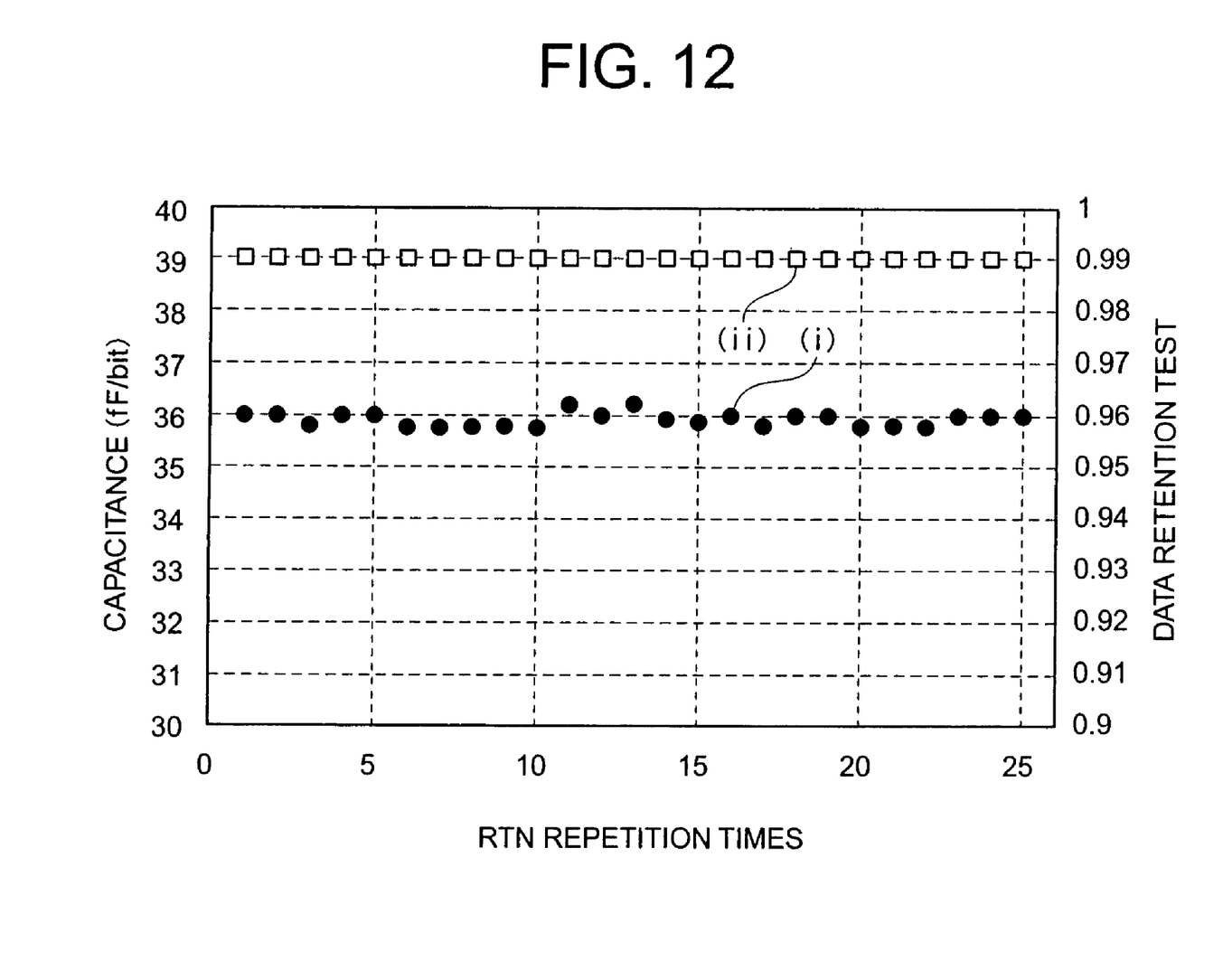
FIG. 12 is a graph showing the relationship between the RTN repetition times in the in-line RTN processing and the capacitance of the memory capacitor as well as the number of samples passing the data retention test for the samples manufactured by the process of the first embodiment.
Figure 13:
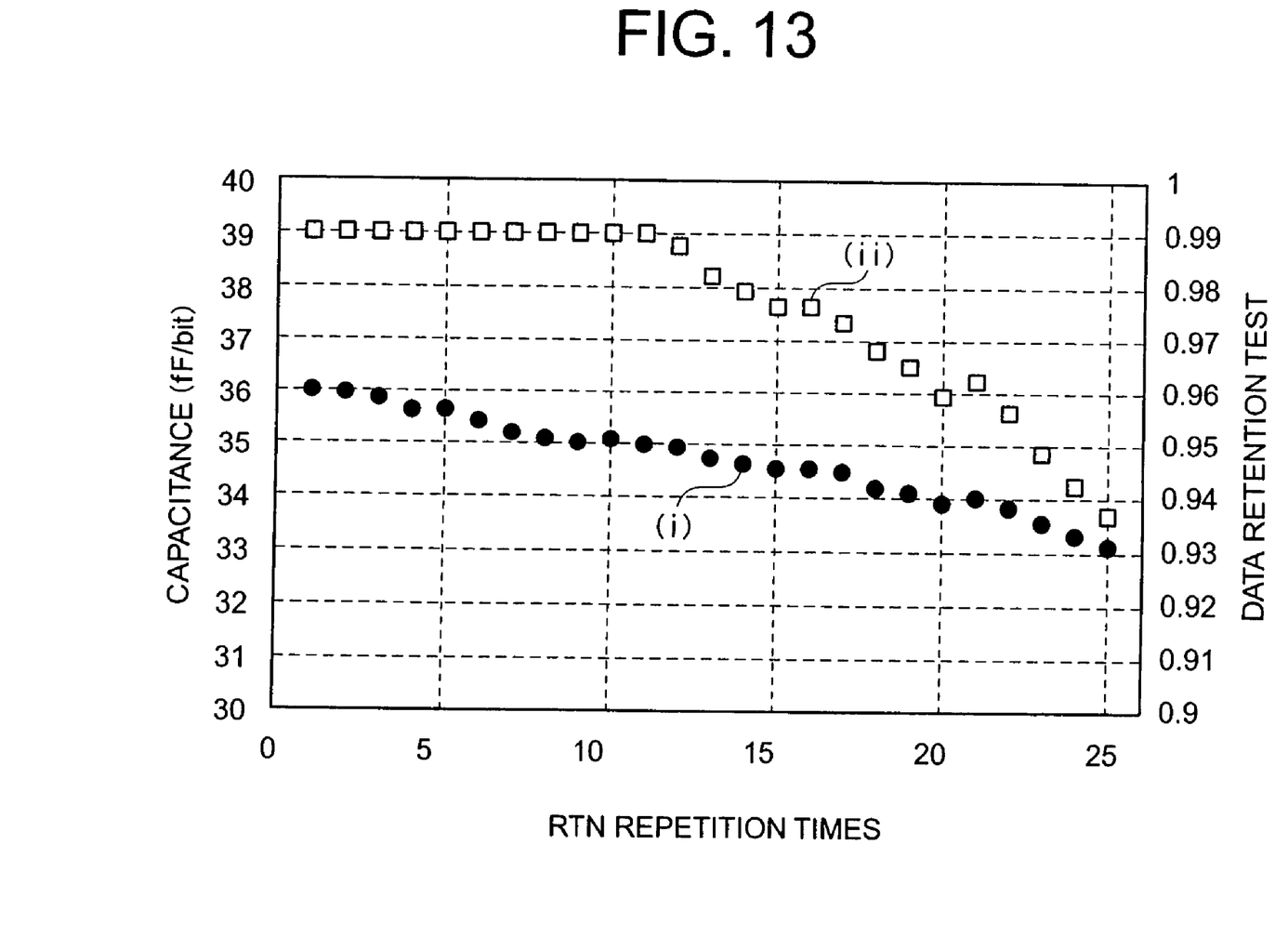
FIG. 13 is a graph showing the relationship between the RTN repetition times in the in-line RTN processing and the capacitance of the memory capacitor as well as the number of samples passing the data retention test for the samples manufactured by the conventional process.

The result of the tests is shown in FIGS. 12 and 13 for respective processes. FIG. 12 shows the result of both the tests for the process of the present embodiment, wherein (i) and (ii) represent the capacitance (fF/bit) in the charge test, and the ratio of the passed samples in the data retention test, respectively. FIG. 13 shows, similarly to FIG. 12, the results of the tests for the conventional process. As understood from FIG. 13, the capacitance of the capacitor is reduced along with the proceeding of RTN treatment in the in-line processing, whereas the ratio in the data retention test is reduced especially for the 12-th and subsequent sheets of the sample wafers.

On the other hand, in the process of the present embodiment, as shown in FIG. 12, the capacitance of the capacitor was maintained substantially constant irrespective of the number of RTN repetition times in the in-line processing, and the ratio in the data retention test is also maintained substantially constant at 99% or above for all the samples. This revealed that the process of the present embodiment provides uniform and excellent capacitor characteristics irrespective of the number of RTN repetition times in the in-line processing.

Figure 8:
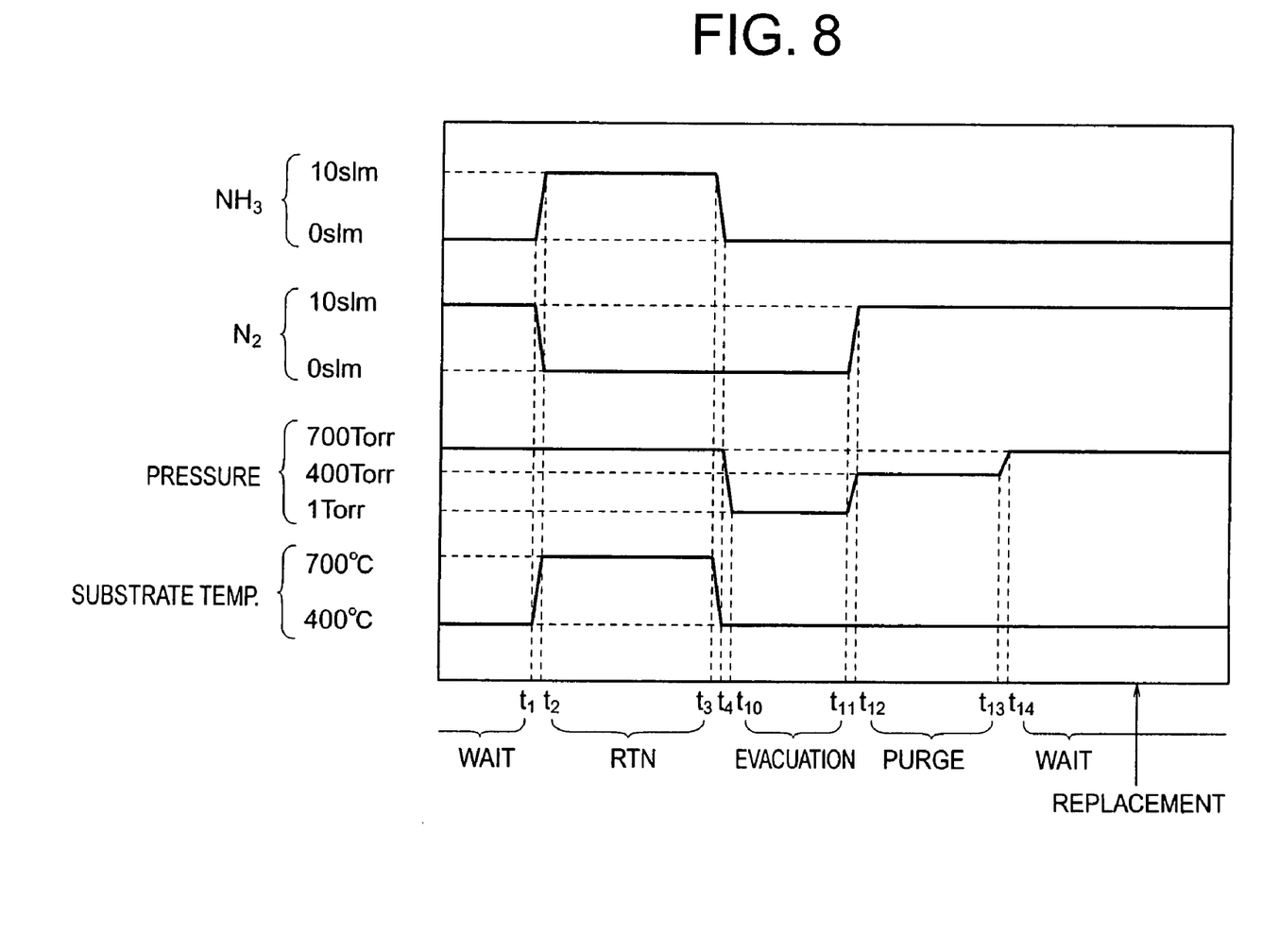
FIG. 8 is a timing chart of the process conditions in a process for manufacturing a semiconductor device according to a second embodiment of the present invention.

FIG. 8 shows a timing chart of process conditions in a process conducted in the reactor chamber according to a second embodiment of the present invention. The process conditions shown in FIG. 8 are similar to the process conditions shown in FIG. 7 except that the evacuation step is performed prior to the low-pressure purge step in the present embodiment. More specifically, the process proceeds similarly to the first embodiment until t4. In the present embodiment, the evacuation step is conducted after t4 to obtain an internal pressure of 1 Torr between t10 and t11. Subsequently, the flow rate of the $N_2$ gas and the internal pressure are set at 10 slm. and 400 Torr, respectively, thereby performing the low-pressure purge step between t12 and t13. Thereafter, the internal pressure is set at 700 Torr at t14. After t14, process conditions in the present embodiment are similar to those after t9 in the first embodiment.

In accordance with the process of the present embodiment, the evacuation step allows the by-product materials attached onto the inner wall of the chamber to be desorped therefrom before strong attachment of the by-product materials onto the inner wall of the chamber. The low-pressure purge step suppresses attachment of the by-product materials floating in the internal of the chamber, and effectively discharge the by-product materials out of the chamber.

Figure 9:
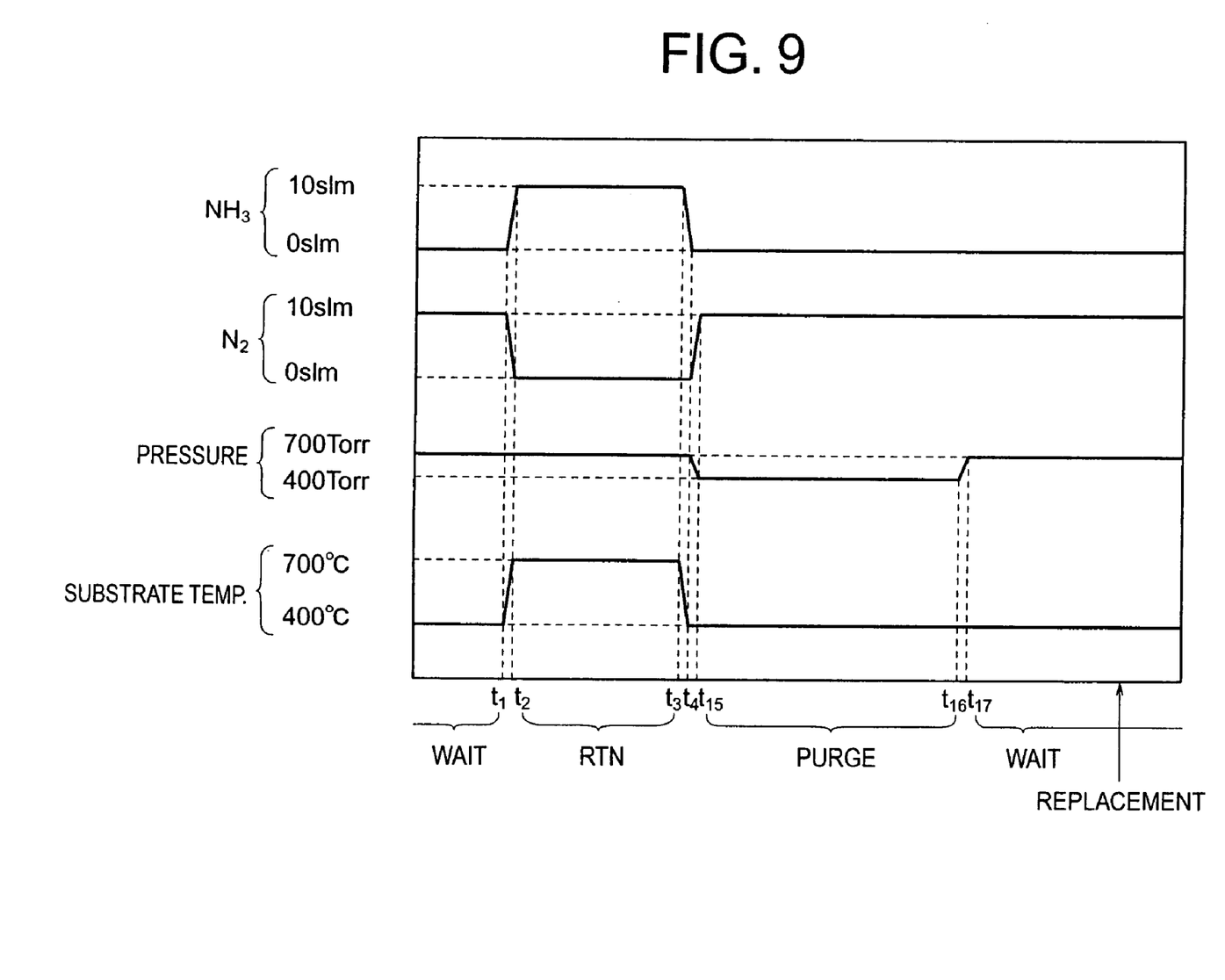
FIG. 9 is a timing chart of the process conditions in a process for manufacturing a semiconductor device according to a third embodiment of the present invention.

FIG. 9 shows a timing chart of process conditions employed in the chamber in a process according to a third embodiment of the present invention. The process of the present embodiment is similar to the process of the first embodiment except that the evacuation step is not performed in the present embodiment. More specifically, the process of the present embodiment is similar to the first embodiment until t4. Thereafter, the flow rate of the $N_2$ gas and the inner pressure of the chamber are set at 10 slm. and 400 Torr, respectively, thereby performing the low-pressure purge step for purging the internal gas from the chamber between t15 and t16. Subsequently, the internal pressure is set at 700 Torr at t17, and the process after t17 in the present embodiment is similar to the process in the first embodiment after t9 in FIG. 7.

In the present embodiment, the additional step includes only the low-pressure purge, thereby simplifying the in-line process in the present invention.

In accordance with the method of the present invention, the reduction of the internal pressure of the reactor chamber reduces the amount of by-product materials attached onto the inner wall of the reactor chamber.

It is preferable that the internal-pressure reducing step include the steps of: providing non-reactive gas in the reactor chamber to purge internal gas in the reactor chamber; and evacuating the internal gas from the reactor chamber.

In an alternative, the internal-pressure reducing step may include the steps of: evacuating internal gas from the reactor chamber; and providing non-reactive gas in the reactor chamber to purge the internal gas in the reactor chamber.

In an alternative, the internal-pressure reducing step may include the steps of: providing non-reactive gas in the reactor chamber to purge internal gas in the reactor chamber.

It is also preferable that the silicon-nitride-film forming step include the step of nitriding a silicon film by using a rapid thermal nitriding (RTN) process.

It is also preferable that the internal-pressure reducing step include the step of setting the internal pressure at 600 Torr or lower.

Since the above embodiments are described only for examples, the present invention is not limited to the above embodiments and various modifications or alterations can be easily made therefrom by those skilled in the art without departing from the scope of the present invention.

What is claimed is:

1. A method of manufacturing semiconductor devices in an in-line processing comprising, between forming a silicon nitride film by using nitrification on a first semiconductor wafer in a reactor chamber having an inner pressure at a specific pressure and forming a silicon nitride film by using nitrification on a second semiconductor wafer in said reactor chamber at said specific pressure reducing said inner pressure from said specific pressure;
raising said inner pressure up to said specific pressure; and
replacing said first semiconductor wafer with said second semiconductor wafer.

2. The method according to claim 1, wherein said reducing includes:

providing non-reactive gas in said reactor chamber to purge internal gas in said reactor chamber; and
evacuating said internal gas from said reactor chamber.

3. The method according to claim 1, wherein said reducing includes:

evacuating internal gas from said reactor chamber; and
providing non-reactive gas in said reactor chamber to purge the internal gas in said reactor chamber.

4. The method according to claim 1, wherein said reducing includes:

providing non-reactive gas in said reactor chamber to purge internal gas in said reactor chamber.

5. The method according to claim 1, wherein said forming includes nitriding a silicon film by using a rapid thermal nitriding process.

6. The method according to claim 1, wherein said reducing includes setting said inner pressure at 600 Torr or lower.

\* \* \* \* \*